(12) United States Patent
Choi et al.

(10) Patent No.: US 10,541,197 B2
(45) Date of Patent: Jan. 21, 2020

(54) PRESS-FIT PIN AND SEMICONDUCTOR PACKAGE INCLUDING THE SAME

(71) Applicant: JMJ KOREA CO., LTD., Gyeonggi-do (KR)

(72) Inventors: Yun Hwa Choi, Gyeonggi-do (KR); Soon Seong Choi, Gyeonggi-do (KR); Jeong Hun Cho, Gyeonggi-do (KR)

(73) Assignee: JMJ KOREA CO., LTD., Gyeonggi-do (KR)

( * ) Notice: Subject to any disclaimer, the term of this patent is extended or adjusted under 35 U.S.C. 154(b) by 0 days.

(21) Appl. No.: 16/038,314

(22) Filed: Jul. 18, 2018

(65) Prior Publication Data

US 2019/0139872 A1 May 9, 2019

(30) Foreign Application Priority Data

Jul. 18, 2017 (KR) .................. 10-2017-0090821

(51) Int. Cl.
*H01L 23/49* (2006.01)
*H01L 23/495* (2006.01)
*H01R 12/58* (2011.01)
*H01L 23/04* (2006.01)

(52) U.S. Cl.
CPC ........ *H01L 23/49555* (2013.01); *H01L 23/49* (2013.01); *H01L 23/49568* (2013.01); *H01R 12/585* (2013.01); *H01L 23/04* (2013.01)

(58) Field of Classification Search
CPC ................................ H01L 23/49; H01L 23/04
See application file for complete search history.

(56) References Cited

U.S. PATENT DOCUMENTS

| 8,092,262 B1* | 1/2012 | Frederick | H01R 12/585 439/751 |
| 8,310,838 B2* | 11/2012 | Kellermann | H05K 3/28 174/266 |
| 8,579,638 B2* | 11/2013 | Schaarschmidt | H01R 12/585 439/82 |
| 8,992,235 B2* | 3/2015 | Kataoka | H01R 12/585 439/751 |

(Continued)

FOREIGN PATENT DOCUMENTS

JP 2005 158507 A 6/2005

*Primary Examiner* — Caridad Everhart
*Assistant Examiner* — Ankush K Singal
(74) *Attorney, Agent, or Firm* — Norris McLaughlin, P.A.

(57) ABSTRACT

A press-fit pin increases contact area with the contact hole to provide appropriate contact pressure, reduce contact resistance, and increase heat transfer efficiency. The press-fit pin is of a semiconductor package including an end portion and a press unit extending from the end portion and is divided into a first press-fitting piece and a second press-fitting piece, the first press-fitting piece forming a convex portion in a first direction perpendicular to the direction of the press-fit pin and bending to a second direction perpendicular to the direction of the press-fit pin and forming 30-110 degrees with the first direction and the second press-fitting piece forming a convex portion in a third direction perpendicular to the direction of the press-fit pin and being 180 degrees with the first direction and bending to a fourth direction perpendicular to the direction of the press-fit pin and forming 250-330 degrees with the first direction.

13 Claims, 19 Drawing Sheets

(56) References Cited

U.S. PATENT DOCUMENTS

| | | | |
|---|---|---|---|
| 9,357,656 B2* | 5/2016 | Patzner | H05K 3/325 |
| 9,431,733 B1* | 8/2016 | Heistand | H01R 43/16 |
| 2007/0010139 A1 | 1/2007 | Chen | |
| 2008/0050946 A1* | 2/2008 | Nunokawa | H01R 12/585 |
| | | | 439/82 |
| 2015/0011132 A1 | 1/2015 | Shibuya et al. | |

* cited by examiner

US 10,541,197 B2

PRESS-FIT PIN AND SEMICONDUCTOR PACKAGE INCLUDING THE SAME

CROSS-REFERENCE TO RELATED APPLICATIONS

This application is based on and claims priority from Korean Patent Application No. 10-2017-0090821, filed on Jul. 18, 2017, with the Korean Intellectual Property Office, the disclosure of which is incorporated herein in its entirety by reference

TECHNICAL FIELD

The present disclosure relates to a press-fit pin and a semiconductor package including the same, and more particularly to a press-fit pin structure which improves a contactability with an external substrate.

BACKGROUND

In order to mount a semiconductor package on an external substrate, generally, a lead frame is mounted in a contact hole of the external substrate and is fixed by a solder. However, such a soldering fixing method requires a separate soldering process and failure may be caused by melting the solder in a high temperature usage environment and an environmental pollution may be caused due to the solder containing lead.

Therefore, a press-fit pin which does not use the solder is mainly used for a power semiconductor package. The press-fit pin has a structure having an elastic force acting on a transverse direction and when the press-fit pin is inserted in a longitudinal direction, the press-fit pin is fixed to the contact hole of the external substrate by the elastic force. The press-fit pin serves as an electrical passage and a heat passage between a semiconductor chip and a contact hole of the substrate and provides a physical adhesiveness.

However, when a contact area between the press-fit pin and the contact hole is small, a contact pressure is reduced so that the press-fit pin may be easily inserted, but there are problems in that a contact resistance is increased due to the small contact area and heat transfer efficiency through the substrate is reduced. In contrast, when the contact area between the press-fit pin and the contact hole is large, the contact resistance is reduced and the heat transfer efficiency through the substrate is increased but a large amount of external force is required to insert the press-fit pin, which may cause cracks in the substrate during the inserting process.

Therefore, a structure which easily inserts the press-fit pin while increasing a contact area between a contact hole of the external substrate and the press-fit pin is demanded. Further, a press-fit structure which may increase the heat transfer efficiency is necessary for a power device element which requires high power, such as electric vehicles.

US Unexamined Patent Application Publication No. 2015-0011132 (by JX Nippon Mining & Metals Corporation, entitled "Press-fit terminal and electronic component using the same") discloses a structure of a general press-fit pin. A general press-fit pin is configured by one end portion and two press-fitting pieces which extend from the end portion to be divided and the press-fitting pieces are fixed to the contact hole through an elastic force acting at 180 degrees in a lateral direction. According to the above-mentioned configuration, the structure of the press-fit pin is simple, but the elastic force locally acts on only two points in the contact hole so that when the press-fit pin is inserted, damages such as a crack may be generated on the external substrate. Further, a contact area between the press-fit pin and the contact hole is small so that there are problems in that a contact resistance is increased and the heat transfer efficiency is degraded.

Further, Japanese Laid-Open Publication No. 2005-158507 (by JSG MFG, entitled "contact for press-fit and press-fit connector using the same") discloses a structure in which a protrusion which is in contact with a contact hole is additionally provided in a body of the press-fit pin. According to this structure, a contact surface with the contact hole is increased so that the contact resistance is reduced and the heat transfer efficiency is increased. However, there is a problem in that the press-fitting of the press-fitting piece is hampered by the protrusion so that it is difficult to insert the press-fit pin.

US Unexamined Patent Application Publication No. 2007-0010139 (by J.S.T corporation, entitled "Pressfit Pin") discloses a press-fit pin including a press-fitting piece which is spirally bent. According to this structure, when the press-fit pin is press-fitted, a contact pressure may be reduced and the contact area between the press-fitting piece and the contact hole is slightly increased. However, according to this structure, the press-fitting pieces of the press-fit pin are in contact with two points in the contact hole so that there is a limitation in ensuring a sufficient contact area.

RELATED ART DOCUMENT

Patent Document

Patent Document 1: US Unexamined Patent Application Publication No. 2015-0011132
Patent Document 2: Japanese Laid-Open Publication No. 2005-158507
Patent Document 1: US Unexamined Patent Application Publication No. 2007-0010139

SUMMARY

The present disclosure has been made in an effort to provide a press-fit pin and a semiconductor package including the same which include two press-fitting pieces extending in two directions so that a contact area between the press-fit pin and a contact hole of an external substrate is effectively increased, thereby reducing a contact resistance and providing an appropriate contact pressure while increasing a heat transfer efficiency.

The present disclosure has been made in an effort to further provide a press-fit pin and a semiconductor package including the same which performs rotary processing on a part of the press-fitting piece to increase a contact area between the press-fit pin and the contact hole of the external substrate.

The present disclosure has been made in an effort to further provide a press-fit pin and a semiconductor package including the same which include a press-fitting piece which has an outer peripheral surface having a shape complementary to an inner peripheral surface of the contact hole of the external substrate, thereby increasing a contact area between the press-fit pin and the contact hole of the external substrate.

The present disclosure has been made in an effort to further provide a press-fit pin and a semiconductor package including the same which prevent the press-fit pin from being excessively inserted into a contact hole through a stepped structure of the press-fit pin.

The present disclosure has been made in an effort to further provide a press-fit pin and a semiconductor package including the same which absorb impact which is applied to the semiconductor package through a bending structure of the press-fit pin at the time of being inserted into a contact hole.

An exemplary embodiment of the present disclosure provides a press-fit pin of a semiconductor package including: an end portion and a press unit which extends from the end portion and is divided into a first press-fitting piece and a second press-fitting piece, in which the first press-fitting piece forms a convex portion in a first direction perpendicular to a direction of the press-fit pin and is bent to a second direction which is perpendicular to the direction of the press-fit pin and forms 30 degrees to 110 degrees with the first direction, and the second press-fitting piece forms a convex portion in a third direction which is perpendicular to the direction of the press-fit pin and forms 180 degrees with the first direction and is bent to a fourth direction which is perpendicular to the direction of the press-fit pin and forms 250 degrees to 330 degrees with the first direction.

In the press fit according to the exemplary embodiment of the present disclosure, the press unit may further include a slit formed between the first press-fitting piece and the second press-fitting piece.

In the press fit according to the exemplary embodiment of the present disclosure, the first press-fitting piece may gradually expand to the first direction as it is further away from the end portion to the press-fit pin direction and then be gradually converged toward the third direction and the second press-fitting piece may gradually expand to the third direction as it is further away from the end portion to the press-fit pin direction and then be gradually converged toward the first direction.

In the press fit according to the exemplary embodiment of the present disclosure, the first press-fitting piece may be gradually bent to the second direction as it is further away from the end portion to the press-fit pin and then be gradually converged toward the fourth direction and the second press-fitting piece may be gradually bent to the fourth direction as it is further away from the end portion to the press-fit pin direction and then be gradually converged toward the second direction.

In the press fit according to the exemplary embodiment of the present disclosure, the first press-fitting piece may most expand to the first direction and may be most bent to the second direction at a contact point which is formed in an area corresponding to 40% to 60% of a height of the press unit and the second press-fitting piece may most expand to the third direction and may be most bent to the fourth direction at the contact point.

In the press fit according to the exemplary embodiment of the present disclosure, the first press-fitting piece may be bent to the second direction which forms 30 degrees to 60 degrees with the first direction and the second press-fitting piece may be bent to the fourth direction which forms 330 degrees to 300 degrees with the first direction.

In the press fit according to the exemplary embodiment of the present disclosure, the first press-fitting piece and the second press-fitting piece may include outer peripheral surfaces having a complementary shape to an inner peripheral surface of a contact hole into which the press-fit pin is inserted.

In the press fit according to the exemplary embodiment of the present disclosure, the first press-fitting piece and the second press-fitting piece may have a transverse cross-section having one quarter circular arc shape at the contact point which is formed in an area corresponding to 40% to 60% of a height of the press unit.

In the press fit according to the exemplary embodiment of the present disclosure, the press unit may further include a first step which is formed in an area corresponding to 60% or more of height of the press unit and prevents the press-fit pin from being excessively inserted.

The press fit according to the exemplary embodiment of the present disclosure may further include: an extension portion which extends from the press unit to be opposite to the end portion and the extension portion further includes a second step which prevents the press-fit pin from being excessively inserted.

The press fit according to the exemplary embodiment of the present disclosure may further include: an extension portion which extends from the press unit to be opposite to the end portion and the extension portion further includes a bending structure which disperses an insertion impact of the press-fit pin.

In the press fit according to the exemplary embodiment of the present disclosure, the extension portion may further include a third step and a fourth step which are formed between the bending structure and the press unit to be coupled to a bottom surface of the package body.

Another exemplary embodiment of the present disclosure provides a semiconductor package including: a semiconductor chip; a lead frame which is electrically connected to the semiconductor chip; and a press-fit pin which extends from the lead frame and includes an end portion and a press unit which extends from the end portion and is divided into a first press-fitting piece and the second press-fitting piece, in which the first press-fitting piece forms a convex portion in a first direction perpendicular to the direction of the press-fit pin and is bent to a second direction which is perpendicular to the direction of the press-fit pin and forms 30 degrees to 110 degrees with the first direction and the second press-fitting piece forms a convex portion in a third direction which is perpendicular to the direction of the press-fit pin and is 180 degrees with the first direction and is bent to a fourth direction which is perpendicular to the direction of the press-fit pin and forms 250 degrees to 330 degrees with the first direction.

In the semiconductor package according to the exemplary embodiment of the present disclosure, the first press-fitting piece and the second press-fitting piece may include outer peripheral surfaces having a complementary shape to an inner peripheral surface of a contact hole into which the press-fit pin is inserted.

Yet another exemplary embodiment of the present disclosure provides a semiconductor package including: a semiconductor chip; a semiconductor substrate on which the semiconductor chip is mounted; and a press-fit pin which is fixed to the semiconductor substrate and includes an end portion, a press unit which extends from the end portion and is divided into a first press-fitting piece and the second press-fitting piece, and an extension portion which extends from the press unit to be opposite to the end portion in which the first press-fitting piece forms a convex portion in a first direction perpendicular to the direction of the press-fit pin and is bent to a second direction which is perpendicular to the direction of the press-fit pin and forms 30 degrees to 110 degrees with the first direction, the second press-fitting piece forms a convex portion in a third direction which is perpendicular to the direction of the press-fit pin and forms 180 degrees with the first direction and is bent to a fourth direction which is perpendicular to the direction of the press-fit pin and forms 250 degrees to 330 degrees with the first direction, and the extension portion further includes a bending structure which disperses an insertion impact of the press-fit pin.

In the press fit according to the exemplary embodiment of the present disclosure, the first press-fitting piece and the second press-fitting piece may include outer peripheral surfaces having a complementary shape to an inner peripheral surface of a contact hole into which the press-fit pin is inserted.

According to the exemplary embodiments of the present disclosure, a press-fit pin and a semiconductor package including the same include two press-fitting pieces extending in two directions so that a contact area between the press-fit pin and a contact hole of an external substrate is effectively increased, thereby reducing a contact resistance and providing an appropriate contact pressure while increasing a heat transfer efficiency.

According to the exemplary embodiment of the present disclosure, a press-fit pin and a semiconductor package including the same perform a rotary processing on a part of the press-fitting piece, thereby increasing a contact area between the press-fit pin and the contact hole of the external substrate.

According to the exemplary embodiment of the present disclosure, a press-fit pin and a semiconductor package including the same include a press-fitting piece which has an outer peripheral surface having a shape complementary to an inner peripheral surface of the contact hole o the external substrate, thereby increasing a contact area between the press-fit pin and the contact hole of the external substrate.

According to the exemplary embodiment of the present disclosure, a press-fit pin and a semiconductor package including the same prevent the press-fit pin from being excessively inserted into a contact hole through a stepped structure of the press-fit pin.

According to the exemplary embodiment of the present disclosure, a press-fit pin and a semiconductor package including the same absorb impact which is applied to the semiconductor package through a bending structure of the press-fit pin at the time of being inserted into a contact hole.

The foregoing summary is illustrative only and is not intended to be in any way limiting. In addition to the illustrative aspects, embodiments, and features described above, further aspects, embodiments, and features will become apparent by reference to the drawings and the following detailed description

BRIEF DESCRIPTION OF THE DRAWINGS

In the following detailed description, reference is made to the accompanying drawing, which forms a part hereof. The illustrative embodiments described in the detailed description, drawing, and claims are not meant to be limiting. Other embodiments may be utilized, and other changes may be made, without departing from the spirit or scope of the subject matter presented here.

DETAILED DESCRIPTION

Figure 1:
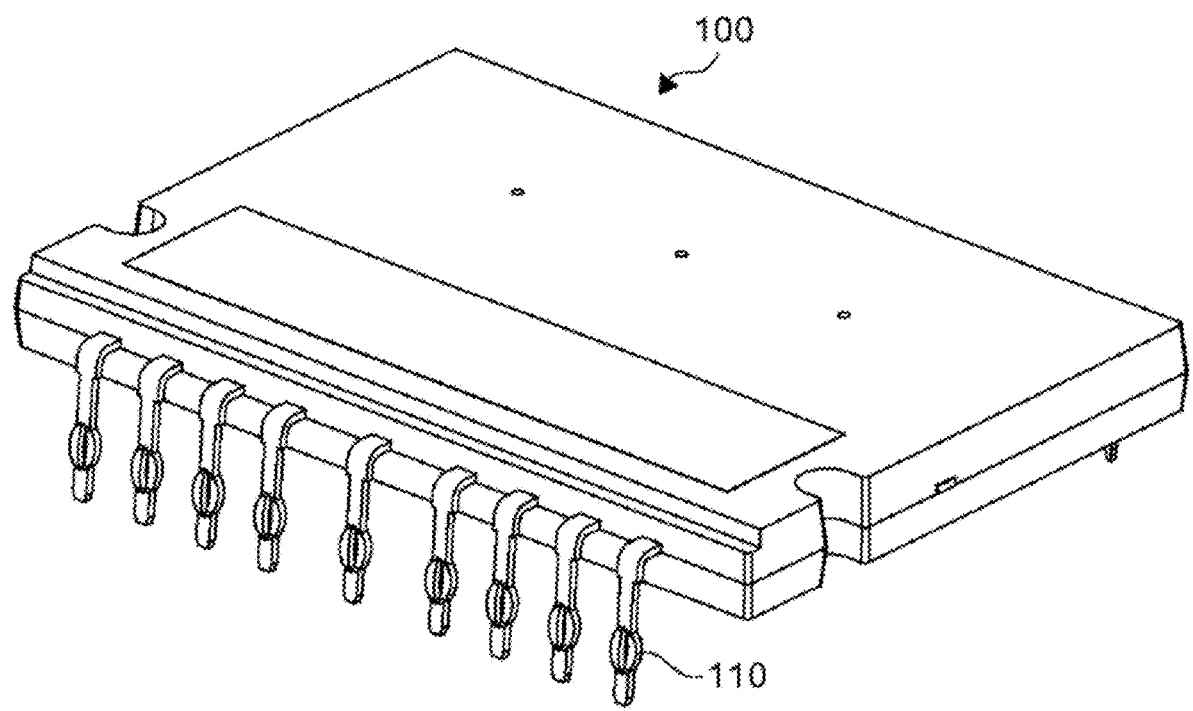
FIG. 1 is a view of an outward appearance of a semiconductor package including a press-fit pin according to a first exemplary embodiment of the present disclosure.

Terms or words used in the present specification and claims should not be interpreted as being limited to typical or dictionary meanings, but should be interpreted as having meanings and concepts which comply with the technical spirit of the present invention, based on the principle that an inventor can appropriately define the concept of the term to describe his/her own invention in the best manner.

Therefore, the embodiments described in the present specification and the configurations illustrated in the drawings correspond to the exemplary embodiment of the present disclosure but do not represent all the technical spirit of the present disclosure. Therefore, the configurations may have equivalents and variations which may be substituted at the time of filing the present disclosure.

In addition, in the specification, unless explicitly described to the contrary, the word "comprise" and variations such as "comprises" or "comprising", will be understood to imply the inclusion of stated elements but not the exclusion of any other elements.

Hereinafter, a press-fit pin 110 according to the present disclosure will be described with reference to the drawings.

Figure 12:
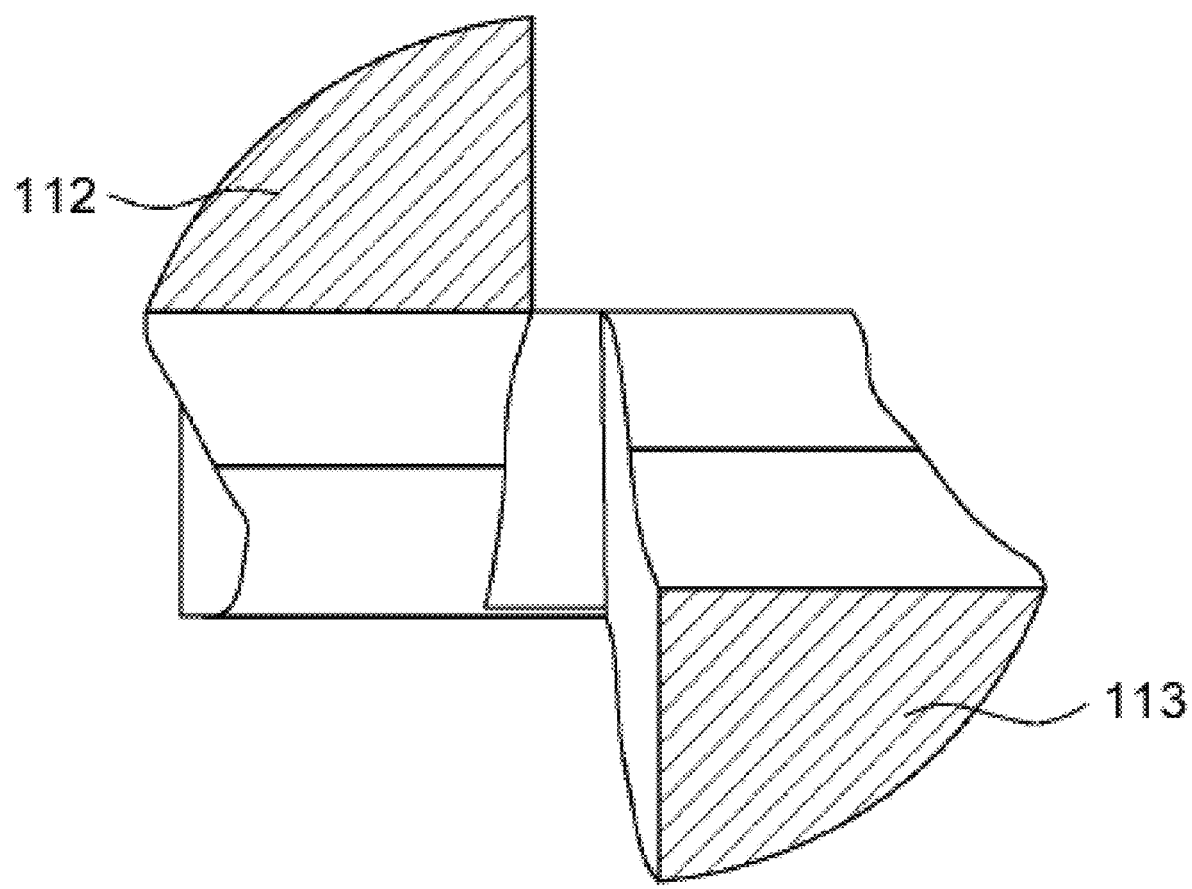
FIG. 12 is a cross-sectional view of a press-fit pin according to a third exemplary embodiment of the present disclosure taken along the line B-B'.

The press-fit pin 110 according to the present disclosure includes an end portion 111 and a press unit. The press-fit pin 110 may be configured as a part of a lead frame as illustrated in FIG. 1 or configured to be attached to a substrate of the semiconductor package 100 as illustrated in FIG. 12. A material of the press-fit pin 110 is not specifically limited and for example, the press-fit pin may be formed of a conductive metal.

Figure 2:
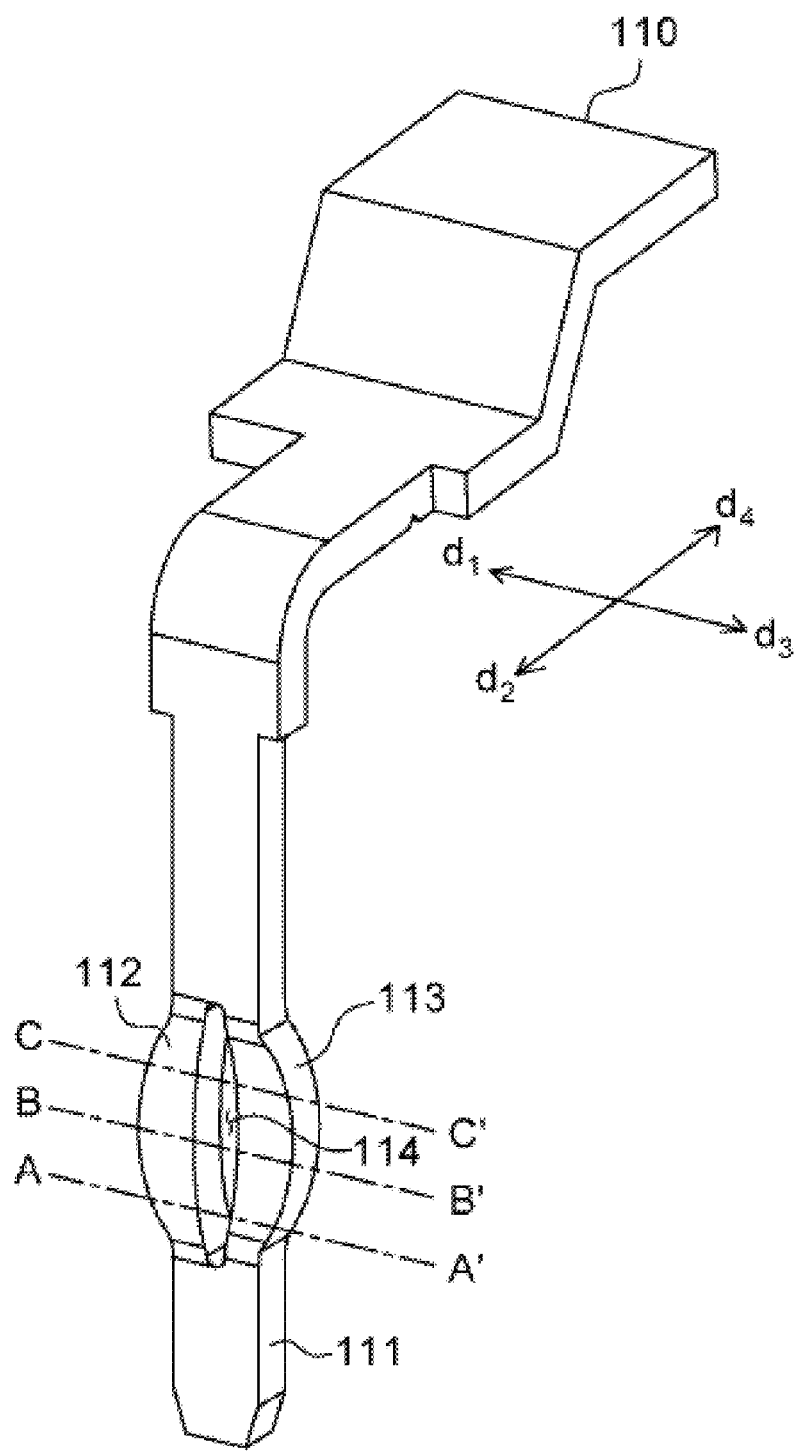
FIG. 2 is a view of an outward appearance of a press-fit pin according to a first exemplary embodiment of the present disclosure.

Even though a shape of the end portion 111 is not specifically limited, in order to easily insert the press-fit pin 110, as illustrated in FIG. 2, the end portion 111 may be formed to have a tapered shape such that a cross-sectional area of a lower portion is smaller than a cross-sectional area of an upper portion.

The press unit extends from the end portion 111 to be fixed to a contact hole 210 of an external substrate 200 by an elastic force and is formed to be divided into a first press-fitting piece 112 and a second press-fitting piece 113. As illustrated in FIG. 2, the first press-fitting piece 112 forms a convex portion in a first direction perpendicular to a direction of the press-fit pin 110 and is bent to a second direction which is perpendicular to the direction of the press-fit pin 110 and forms 30 degrees to 110 degrees with the first direction. The second press-fitting piece 113 forms a convex portion in a third direction which is perpendicular to a direction of the press-fit pin 110 and forms 180 degrees with the first direction and is bent to a fourth direction which is perpendicular to the direction of the press-fit pin 110 and forms 250 degrees to 330 degrees with the first direction. In this case, the press unit further includes a slit 114 formed between the first press-fitting piece 112 and the second press-fitting piece 113 to provide an appropriate contact pressure.

In this case, the first direction and the third direction are formed in the direction of 180 degrees. However, the second direction and the fourth direction may be formed in the direction of 180 degrees as illustrated in FIGS. 2 to 5 to uniformly distribute the contact pressure of the press-fit pin 110 on the contact hole 210.

Figure 6:
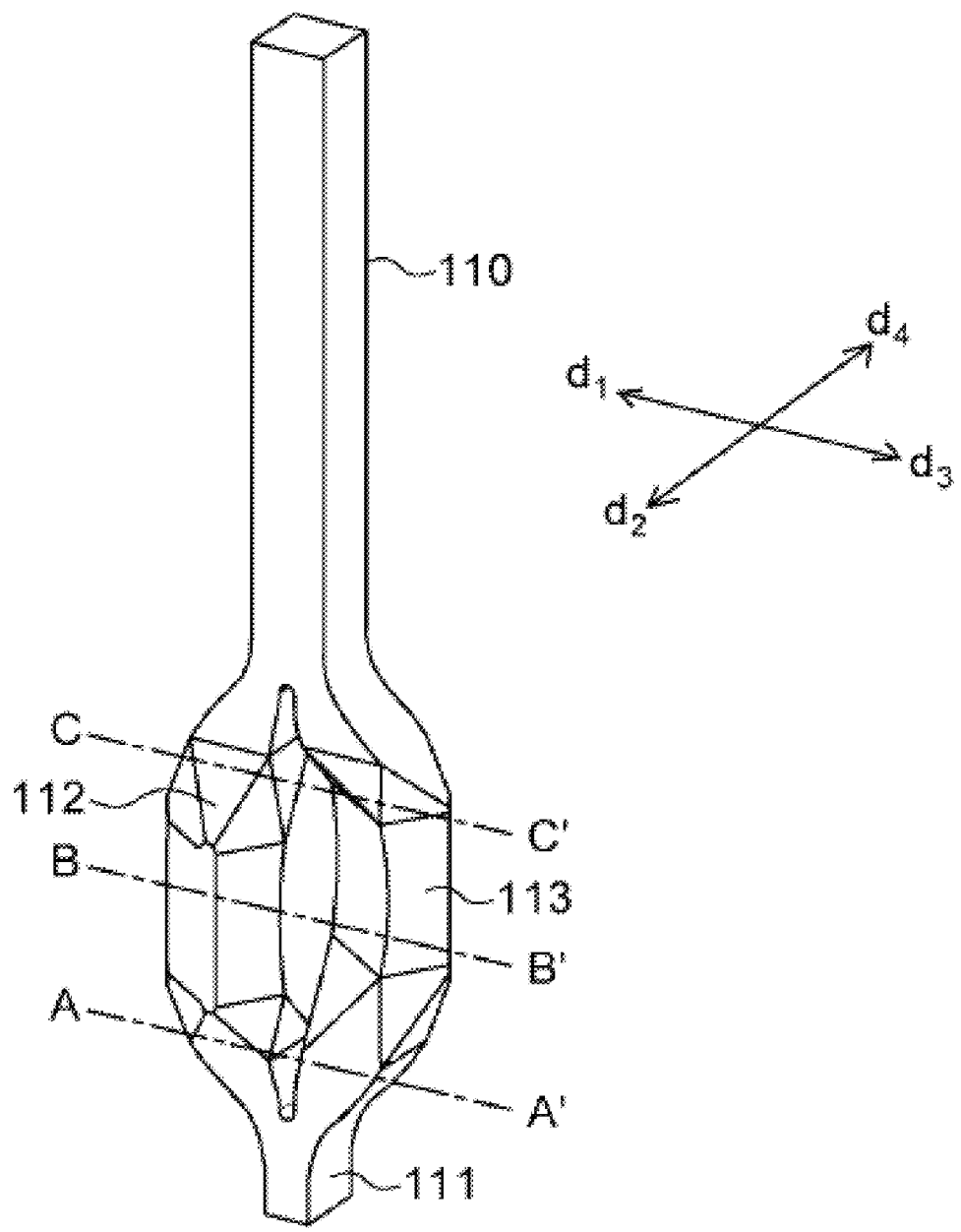
FIG. 6 is a view of an outward appearance of a press-fit pin according to a second exemplary embodiment of the present disclosure.
Figure 7:
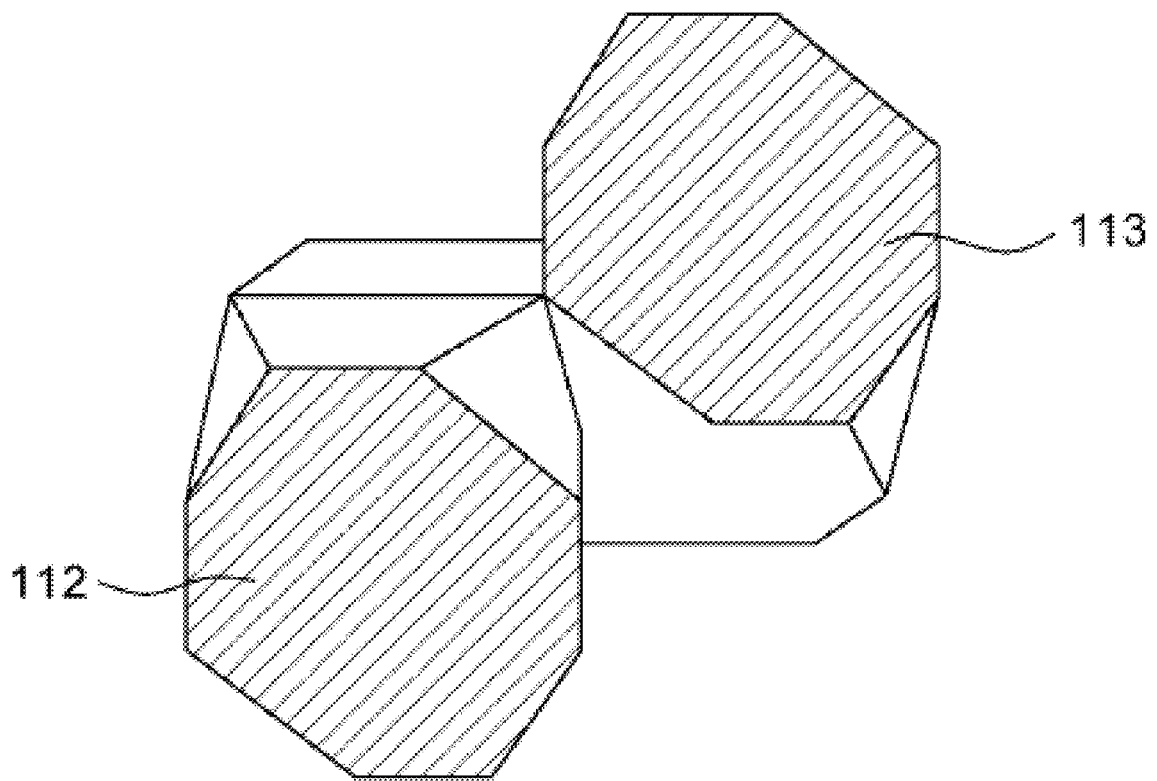
FIG. 7 is a cross-sectional view of a press-fit pin according to a second exemplary embodiment of the present disclosure taken along the line A-A'.
Figure 8:
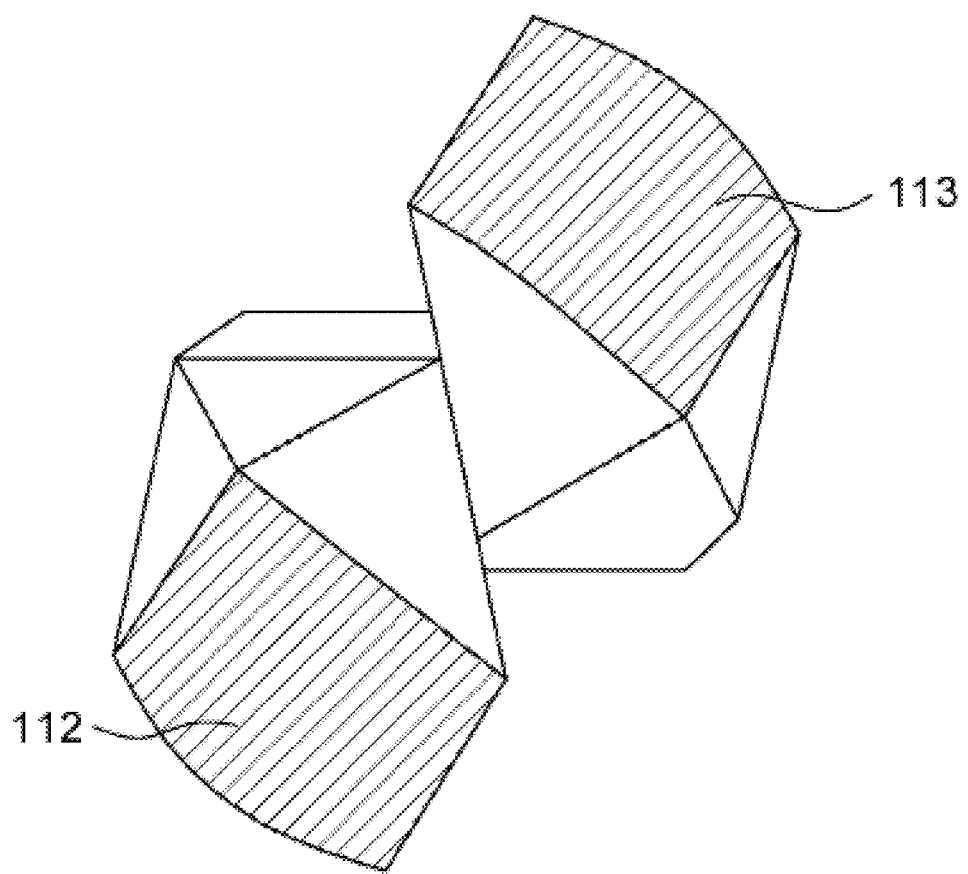
FIG. 8 is a cross-sectional view of a press-fit pin according to a second exemplary embodiment of the present disclosure taken along the line B-B'.

More desirably, the first press-fitting piece 112 may be bent to the second direction which forms 30 degrees to 60 degrees with the first direction as illustrated in FIGS. 6 to 9 and the second press-fitting piece 113 may be bent to the fourth direction which forms 330 degrees to 300 degrees with the first direction. Such a configuration is provided to maximize a contact area of the intermediate end portion 111 of the press unit and the contact hole 210 as illustrated in FIG. 8 so that effects of decreasing the contact resistance and increasing a heat transfer efficiency may be provided.

Figure 3:
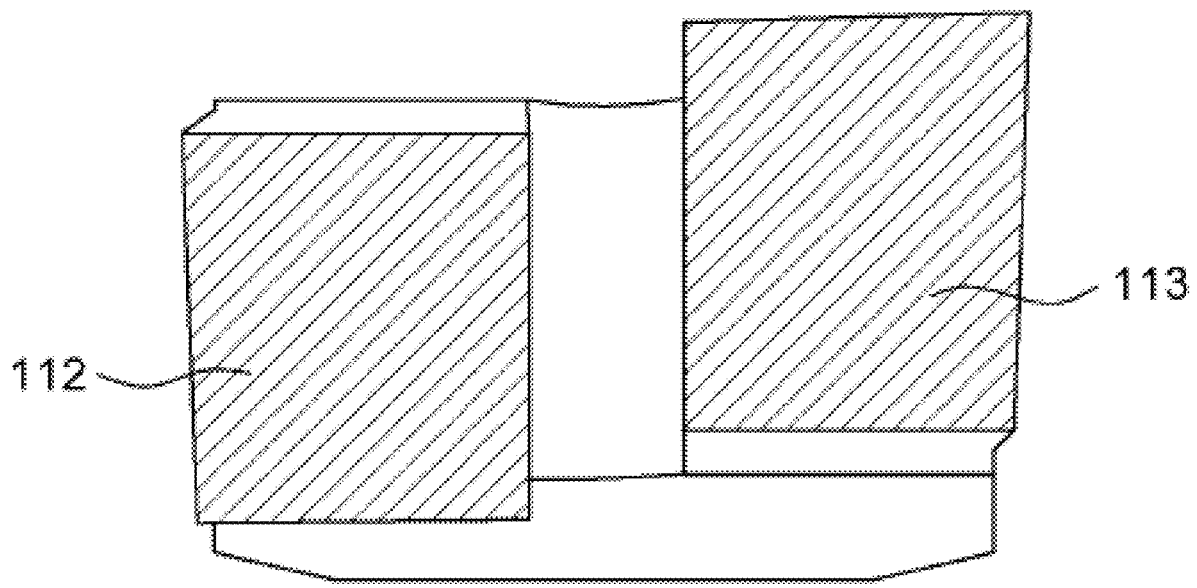
FIG. 3 is a cross-sectional view of a press-fit pin according to a first exemplary embodiment of the present disclosure taken along the line A-A'.
Figure 4:
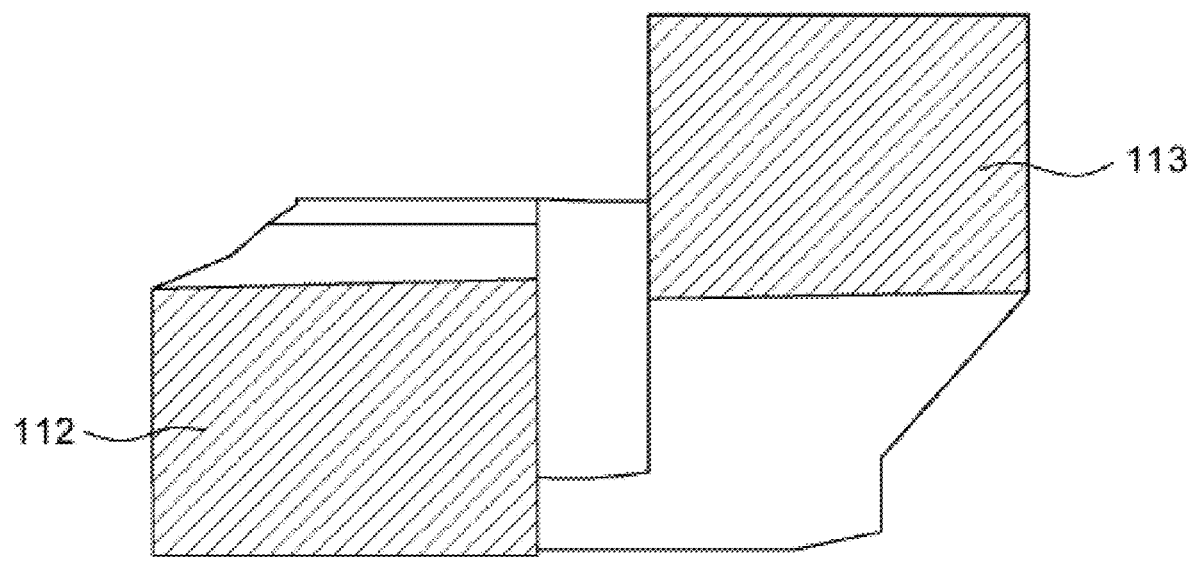
FIG. 4 is a cross-sectional view of a press-fit pin according to a first exemplary embodiment of the present disclosure taken along the line B-B'.
Figure 5:
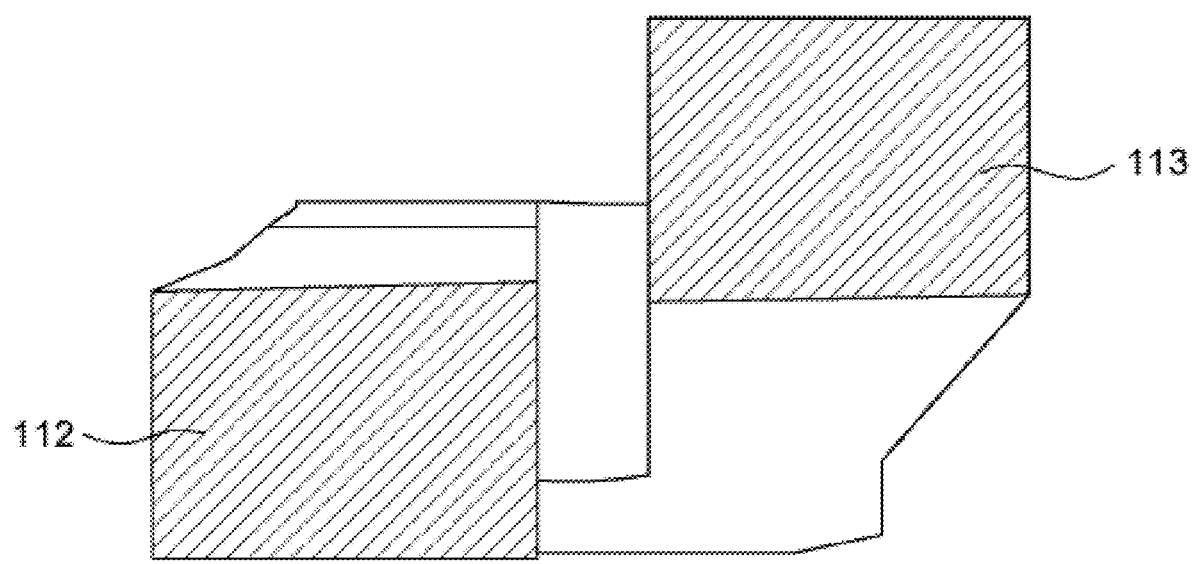
FIG. 5 is a cross-sectional view of a press-fit pin according to a first exemplary embodiment of the present disclosure taken along the line C-C'.

FIGS. 1 to 5 illustrate a first exemplary embodiment in which the first press-fitting piece 112 is bent to the second direction which forms 90 degrees with the first direction and the second press-fitting piece 113 is bent to the fourth direction which forms 270 degrees with the first direction. FIG. 1 illustrates an outward appearance of a semiconductor package 100 including a press-fit pin 110 according to a first exemplary embodiment, FIG. 2 illustrates a lead frame including a press-fit pin 110 according to a second exemplary embodiment of the present disclosure, FIG. 3 illustrates a transverse cross-section of a lower end portion 111 of a press unit taken along the line A-A' of FIG. 2, FIG. 4 illustrates a transverse cross-section of an intermediate end portion 111 of a press unit taken along the line B-B' of FIG. 2, and FIG. 5 illustrates a transverse cross-section of an upper end portion 111 of a press unit taken along the line C-C' of FIG. 2.

Figure 9:
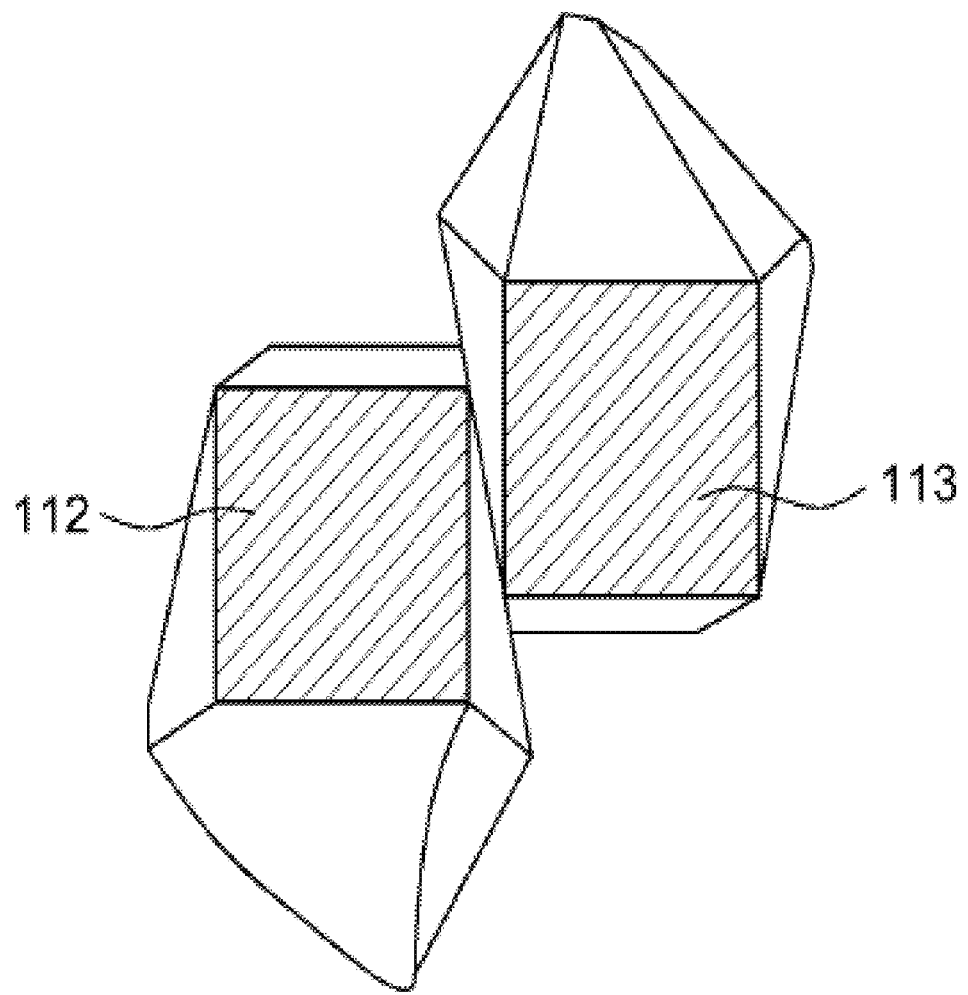
FIG. 9 is a cross-sectional view of a press-fit pin according to a second exemplary embodiment of the present disclosure taken along the line C-C'.

FIGS. 6 to 9 illustrate a second exemplary embodiment in which the first press-fitting piece 112 is bent to the second direction which forms 45 degrees with the first direction and the second press-fitting piece 113 is bent to the fourth direction which forms 315 degrees with the first direction. FIG. 6 illustrates a press-fit pin 110 according to a second exemplary embodiment, FIG. 7 illustrates a transverse cross-section of a lower end portion 111 of a press unit taken along the line A-A' of FIG. 6, FIG. 8 illustrates a transverse cross-section of an intermediate end portion 111 of a press unit taken along the line B-B' of FIG. 6, and FIG. 9 illustrates a transverse cross-section of an upper end portion 111 of a press unit taken along the line C-C' of FIG. 6.

Similarly to the first exemplary embodiment, the second direction and the fourth direction may be formed to have directions of 90 degrees and 270 degrees from the first direction, respectively. According to this exemplary embodiment, the press-fit pin 110 may be formed by bending the first press-fitting piece 112 with a convex portion formed in the first direction to the second direction and the second press-fitting piece 113 with a convex portion formed in the second direction to the fourth direction.

Similarly to the second exemplary embodiment, the second direction and the fourth direction may be formed to have a direction of 45 degrees and 315 degrees from the first direction, respectively. According to the exemplary embodiment, the press-fit pin 110 may be formed such that after bending the first press-fitting piece 112 with a convex portion formed in the first direction at 90 degrees of the first direction, the first press-fitting piece 112 is subjected to a rotary-processing to be 45 degrees of the first direction and after bending the second press-fitting piece 113 with a convex portion formed in the third direction at 270 degrees of the first direction, the second press-fitting piece 113 is subjected to a rotary-processing to be 315 degrees of the first direction.

The convex portions of the first press-fitting piece 112 and the second press-fitting piece 113 are formed in a smooth curved shape, so that the press-fitting impact of the press-fitting pin 110 may be alleviated. To this end, the first press-fitting piece 112 may be configured so as to gradually expand in the first direction as it is further away from the end portion to the direction of the press-fit pin 110 as illustrated in FIGS. 3 and 4 and be gradually converged toward the third direction as illustrated in FIGS. 4 and 5. Similarly, the second press-fitting piece 113 may be configured so as to gradually expand as it is further away from the end portion to the third direction of the press-fit pin 110 at the end portion 111 and be gradually converged toward the first direction.

The bending shapes of the first press-fitting piece 112 and the second press-fitting piece 113 are formed in a smooth curved shape, so that the press-fitting impact of the press-fitting pin 110 may be alleviated. To this end, the first press-fitting piece 112 may be configured so as to be gradually bent to the second direction as it is further away from the end portion 111 toward the press-fit pin 110 as illustrated in FIGS. 3 and 4 and be gradually converged toward the fourth direction as illustrated in FIGS. 4 and 5. Similarly, the second press-fitting piece 113 may be configured so as to be gradually bent to the fourth direction as it is further away from the end portion 111 toward the press-fit pin 110 and be gradually converged toward the second direction.

A contact point (or a contact surface) where the first press-fitting piece 112 and the second press-fitting piece 113 are in contact with the contact hole 210 may be an intermediate end portion 111 of the press unit of the press-fit pin 110. To this end, as illustrated in FIG. 4, the first press-fitting piece 112 most expands in the first direction and is most bent to the second direction at a contact point formed in an area corresponding to 40 to 60% of a height of the press unit and the second press-fitting piece 113 may most expand in the third direction and most bent to the fourth direction at the contact point.

Another method for increasing the contact area of the press-fit pint 110 and the contact hole 210 is to form a shape of an outer peripheral surface of the press-fit pin 110 to be complementary to an inner peripheral surface of the contact hole 210. To this end, the first press-fitting piece 112 and the second press-fitting piece 113 may be configured to include an outer peripheral surface having a shape complementary to the inner peripheral surface of the contact hole 210 into which the press-fit pin 110 is inserted.

Figure 10:
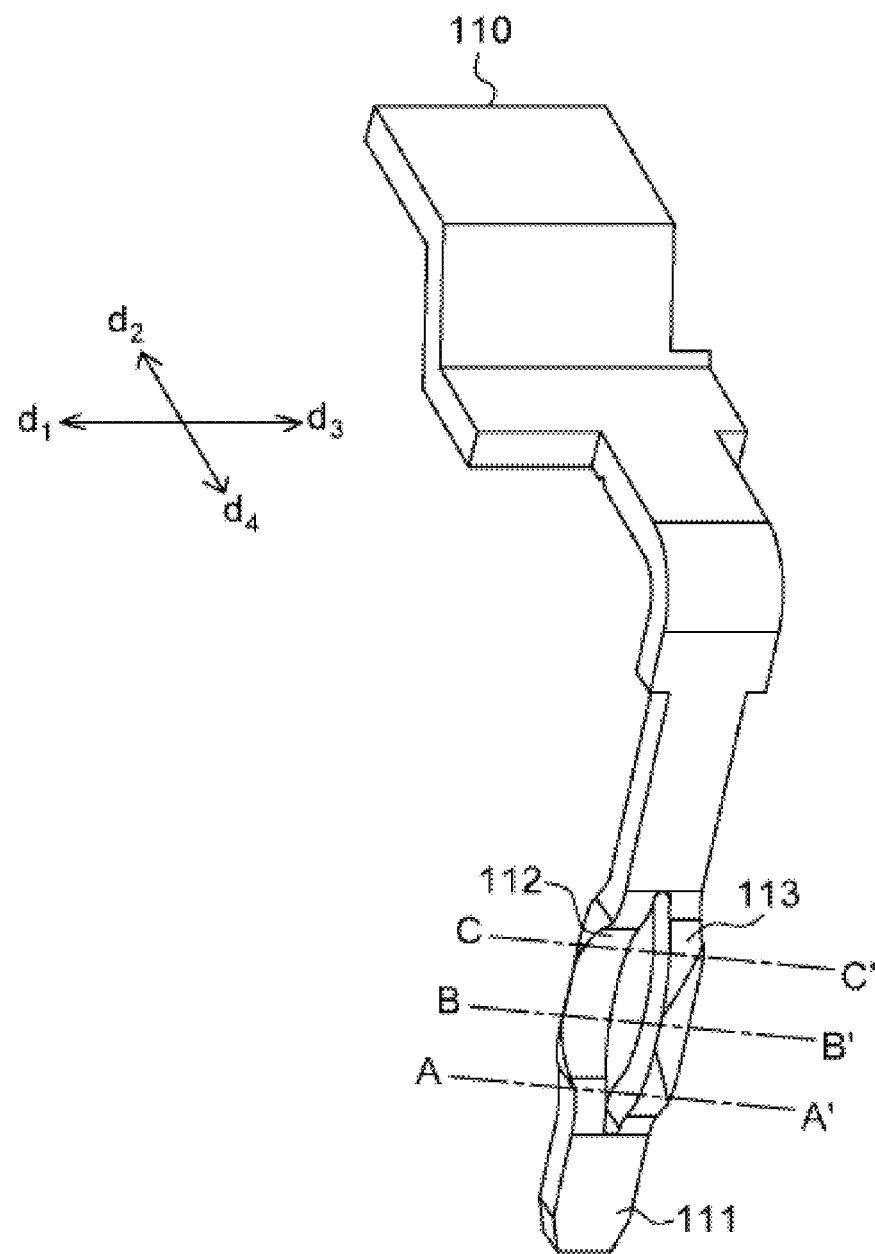
FIG. 10 is a view of an outward appearance of a press-fit pin according to a third exemplary embodiment of the present disclosure.
Figure 11:
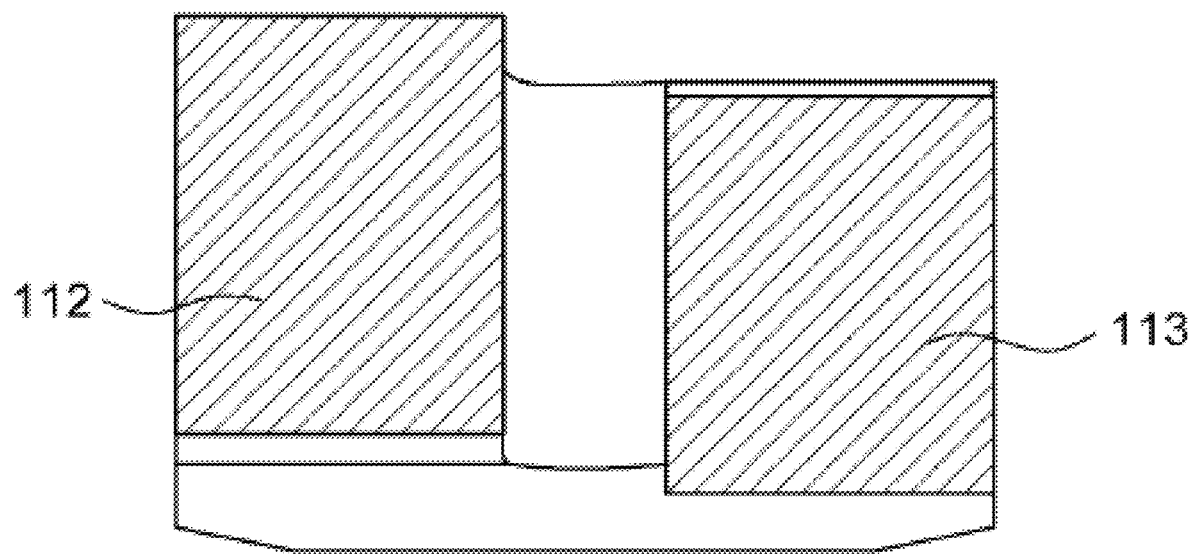
FIG. 11 is a cross-sectional view of a press-fit pin according to a third exemplary embodiment of the present disclosure taken along the line A-A'.
Figure 13:
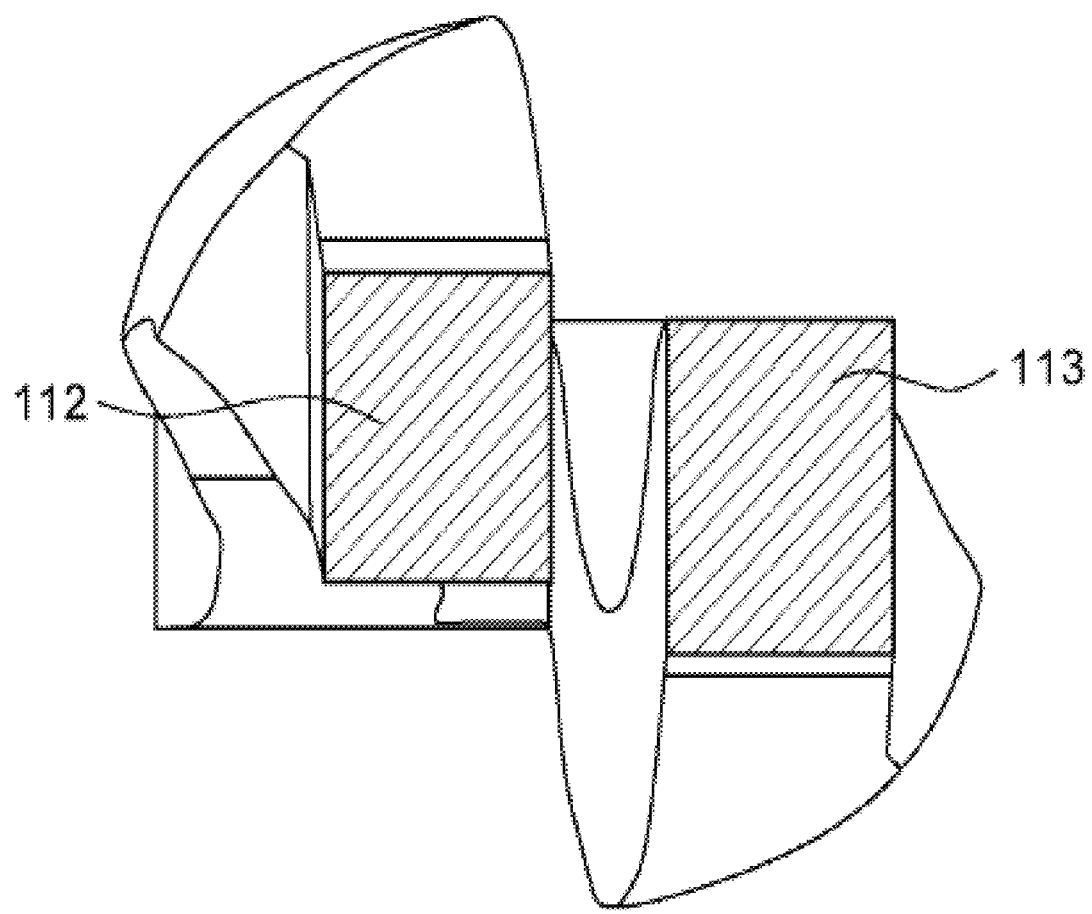
FIG. 13 is a cross-sectional view of a press-fit pin according to a third exemplary embodiment of the present disclosure taken along the line C-C'.

For example, the press-fit pin 110 which is mounted on the external substrate 200 including a circular contact hole 210 may have a shape of the third exemplary embodiment illustrated in FIGS. 10 to 13. FIGS. 10 to 13 illustrate a third exemplary embodiment in which an outer peripheral surface of a partial area of the first press-fitting piece 112 and the second press-fitting piece 113 has a complementary shape to an inner peripheral surface of the contact hole 210. FIG. 10 illustrates a lead frame including a press-fit pin 110 according to a third exemplary embodiment of the present disclosure, FIG. 11 illustrates a transverse cross-section of a lower end portion 111 of a press unit taken along the line A-A' of FIG. 10, FIG. 12 illustrates a transverse cross-section of an intermediate end portion 111 of a press unit taken along the line B-B' of FIG. 10, and FIG. 13 illustrates a transverse cross-section of an upper end portion 111 of a press unit taken along the line C-C' of FIG. 10.

According to the third exemplary embodiment, cross-sectional shapes of a lower end portion 111 and a distal end portion 111 of the first press-fitting piece 112 and the second press-fitting piece 113 of the press-fit pin 110 have rectangular shapes, but a cross-sectional shapes of an intermediate end portion 111 of the first press-fitting piece 112 and the second press-fitting piece 113 which is directly bonded to the contact hole 210 may be formed to have substantially one quarter of circular arc shape. That is, the first press-fitting piece 112 and the second press-fitting piece 113 may have a quarter of circular arc shaped transverse cross-section at the contact point formed in an area corresponding to 40% to 60% of the height of the press unit.

Figure 14:
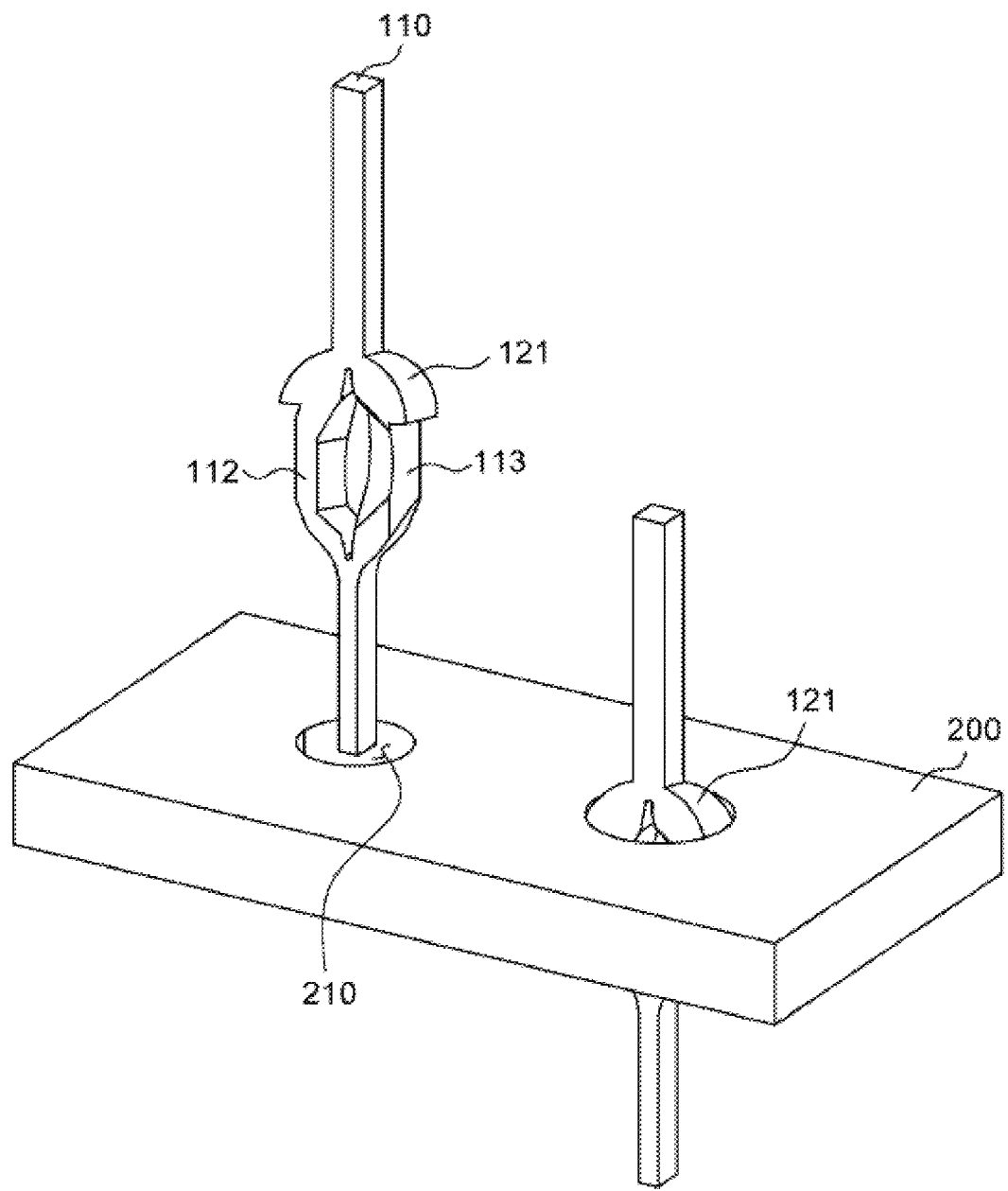
FIG. 14 is a view of a coupling state of a press-fit pin according to an exemplary embodiment of the present disclosure which includes a first step and a contact hole.

In the meantime, when the press-fit pin 110 is excessively inserted, not only the physical coupling state, but also an electrical and thermal contact is degraded. In order to prevent this, as illustrated in FIG. 14, the press unit may further include a first step 121 which is formed in an area corresponding to 60% or more of the height of the press unit and prevent the press-fit pint 110 from being excessively inserted.

Figure 15:
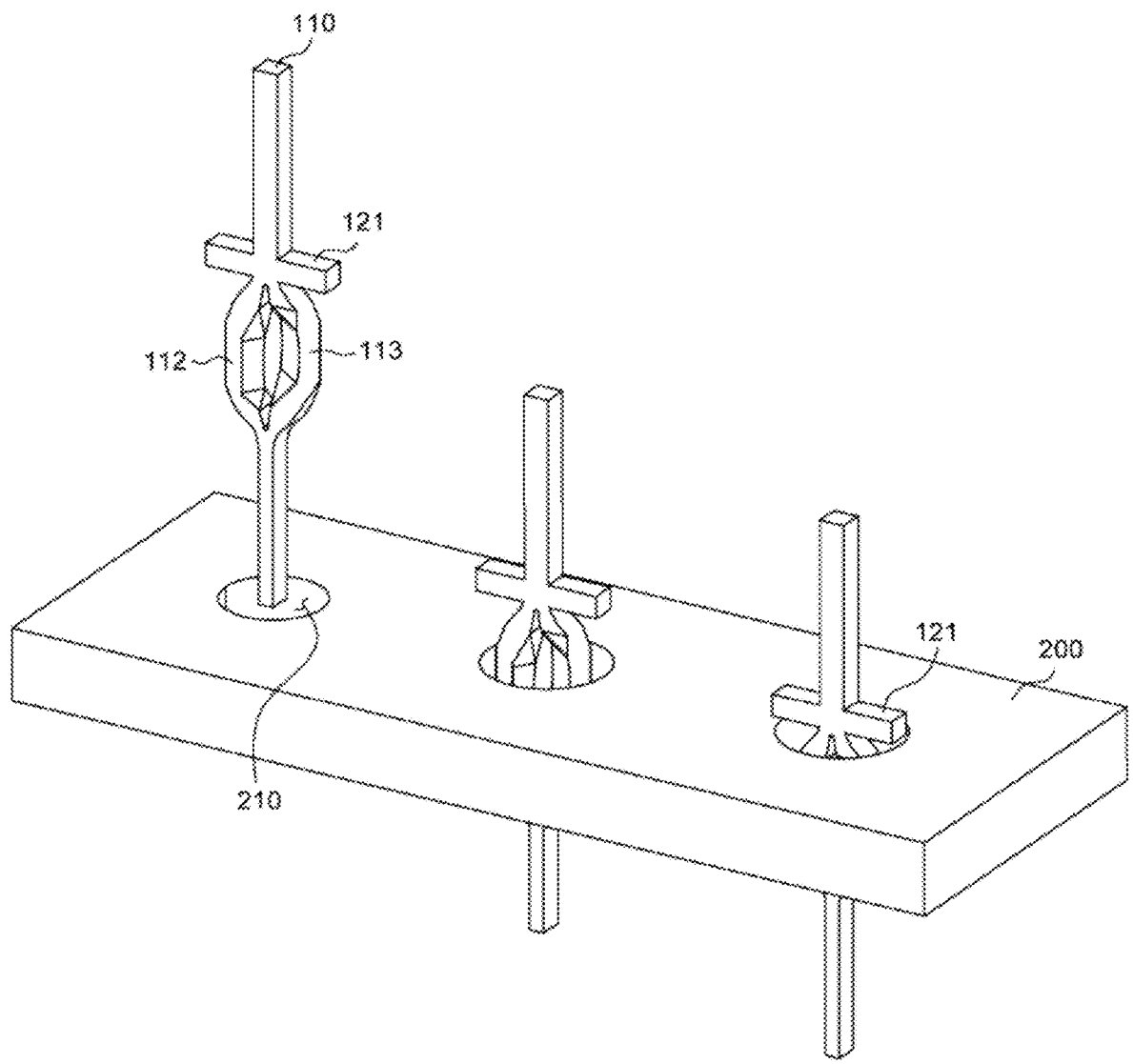
FIG. 15 is a view of a coupling state of a press-fit pin according to an exemplary embodiment of the present disclosure which includes a second step and a contact hole.

When a thickness of the external substrate 200 is large, as illustrated in FIG. 15, the press-fit pin may further include an extension portion 124 which extends from the press unit to be opposite to the end portion 111 and the extension portion 124 may further include a second step 122 which prevents the press-fit pin 110 from being excessively inserted.

Figure 16:
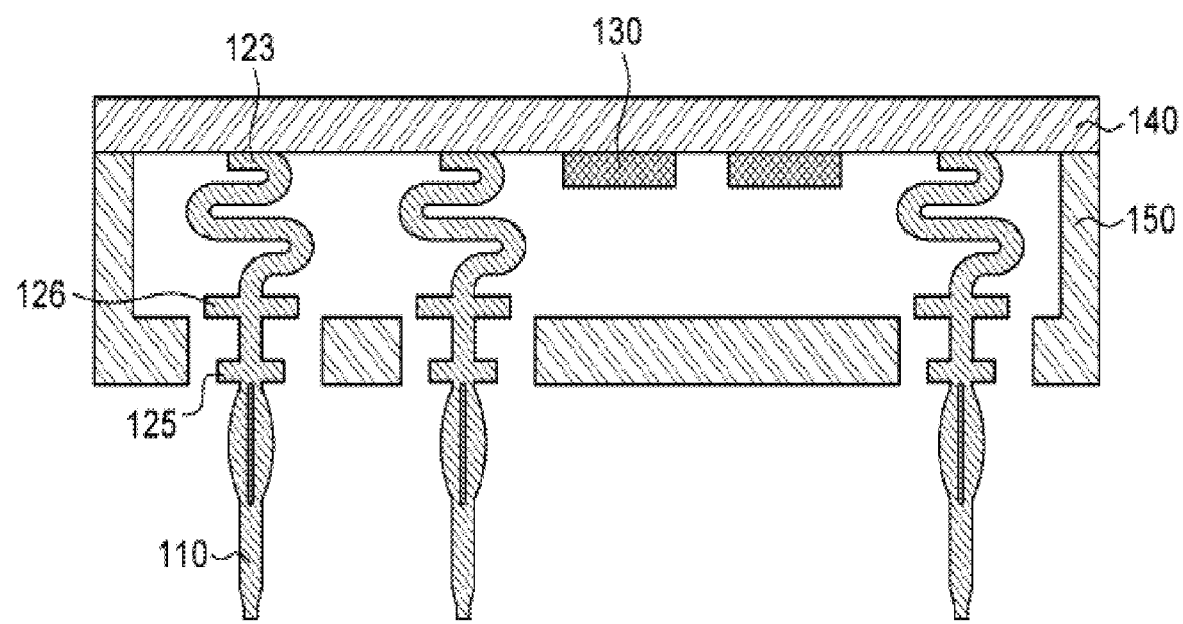
FIG. 16 is a cross-sectional view of a semiconductor package including a press-fit pin according to an exemplary embodiment of the present disclosure which includes a bending structure.

In the meantime, in the structure of the semiconductor package 100 as illustrated in FIG. 16, the press-fit pin 110 is vertically attached to the semiconductor substrate 140. According to this structure, an insertion impact caused by inserting the press-fit pin 110 into the contact hole 210 may be directly applied to the semiconductor substrate 140 so that the semiconductor substrate may be broken. In order to prevent this, the press-fit pin 110 further includes an extension portion 124 extending from the press unit to be opposite to the end portion 111 and the extension portion 124 may further include a bending structure 123 to disperse the insertion impact of the press-fit pin 110.

Further, in order to fix the press-fit pin to a bottom surface of the package body 150, the extension portion 124 may further include a third step 125 and a fourth step 126 which are formed between the bending structure 123 and the press unit to be coupled with the bottom surface of the package body 150.

Hereinafter, a semiconductor package 100 including a press-fit pin 110 according to the present disclosure will be described. The semiconductor package 100 according to the present disclosure includes a semiconductor chip 130, a lead frame, and a press-fit pin 110, as illustrated in FIG. 1. Even though the semiconductor chip 130 is not specifically limited, a power semiconductor chip 130, such as a power MOSFET semiconductor, which is used in a high heat and high voltage environment. The lead frame provides an electrical path between the external substrate 200 and the semiconductor chip 130. The lead frame may be directly electrically connected to the semiconductor chip 130 or indirectly connected to the semiconductor chip 130 by means of a medium such as a metal wire or a metal clip. The press-fit pin 110 is formed to extend from the lead frame and include an end portion 111 and a press unit which extends from the end portion 111 and is divided into a first press-fitting piece 112 and a second press-fitting piece 113. In addition, the semiconductor package 100 may further include a molding portion which configures an outward appearance of the semiconductor chip 130.

The first press-fitting piece 112 forms a convex portion in a first direction perpendicular to a direction of the press-fit pin 110 and is bent to a second direction which is perpendicular to the direction of the press-fit pin 110 and forms 30 degrees to 110 degrees with the first direction. The second press-fitting piece 113 forms a convex portion in a third direction which is perpendicular to a direction of the press-fit pin 110 and forms 180 degrees with the first direction and is bent to a fourth direction which is perpendicular to the direction of the press-fit pin 110 and forms 250 degrees to 330 degrees with the first direction.

In this case, the second direction and the fourth direction may be formed to have directions of 90 degrees and 270 degrees with the first direction, respectively as described in the first exemplary embodiment or may be formed to have directions of 45 degrees and 315 degrees with the first direction as described in the second exemplary embodiment to increase a contact area. In the second exemplary embodiment, the first press-fitting piece 112 is bent to the second direction which forms 30 to 60 degrees with the first direction and the second press-fitting piece 113 is bent to the fourth direction which forms 330 to 300 degrees with the first direction.

As another method for increasing a contact area, as described in a third exemplary embodiment illustrated in FIG. 10, the first press-fitting piece 112 and the second press-fitting piece 113 may be configured to include an outer peripheral surface having a shape complementary to the inner peripheral surface of the contact hole 210 into which the press-fit pin 110 is inserted.

Hereinafter, as illustrated in FIG. 16, a semiconductor package 100 in which the press-fit pin 110 does not configure a part of the lead frame will be described. The semiconductor package includes a semiconductor chip 130, a semiconductor substrate 140, and a press-fit pin 110. Even though the semiconductor chip 130 is not specifically limited, a power semiconductor chip 130 such as a power MOSFET semiconductor which is used in a high heat and high voltage environment. A semiconductor chip 130 is mounted on the semiconductor substrate 140. The press-fit pin 110 is fixed to the semiconductor substrate 140 and includes an end portion 111, a press unit which extends from the end portion 111 and is divided into a first press-fitting piece 112 and a second press-fitting piece 113, and an extension portion 124 which extends from the press unit to be opposite to the end portion 111.

The semiconductor package 100 may further include a package body which configures an outward appearance of the semiconductor chip 130.

The first press-fitting piece 112 forms a convex portion in a first direction perpendicular to a direction of the press-fit pin 110 and is bent to a second direction which is perpendicular to the direction of the press-fit pin 110 and forms 30 degrees to 110 degrees with the first direction. The second press-fitting piece 113 forms a convex portion in a third direction which is perpendicular to a direction of the press-fit pin 110 and forms 180 degrees with the first direction and is bent to a fourth direction which is perpendicular to the direction of the press-fit pin 110 and forms 250 degrees to 330 degrees with the first direction.

In this case, the second direction and the fourth direction may be formed to have directions of 90 degrees and 270 degrees with the first direction, respectively as described in the first exemplary embodiment or may be formed to have directions of 45 degrees and 315 degrees with the first direction as described in the second exemplary embodiment to increase a contact area. In the second exemplary embodiment, the first press-fitting piece 112 is bent to the second direction which forms 30 to 60 degrees with the first direction and the second press-fitting piece 113 is bent to the fourth direction which forms 330 to 300 degrees with the first direction.

As another method for increasing a contact area, as described in a third exemplary embodiment illustrated in FIG. 10, the first press-fitting piece 112 and the second press-fitting piece 113 may be configured to include an outer peripheral surface having a shape complementary to the inner peripheral surface of the contact hole 210 into which the press-fit pin 110 is inserted.

Figure 17:
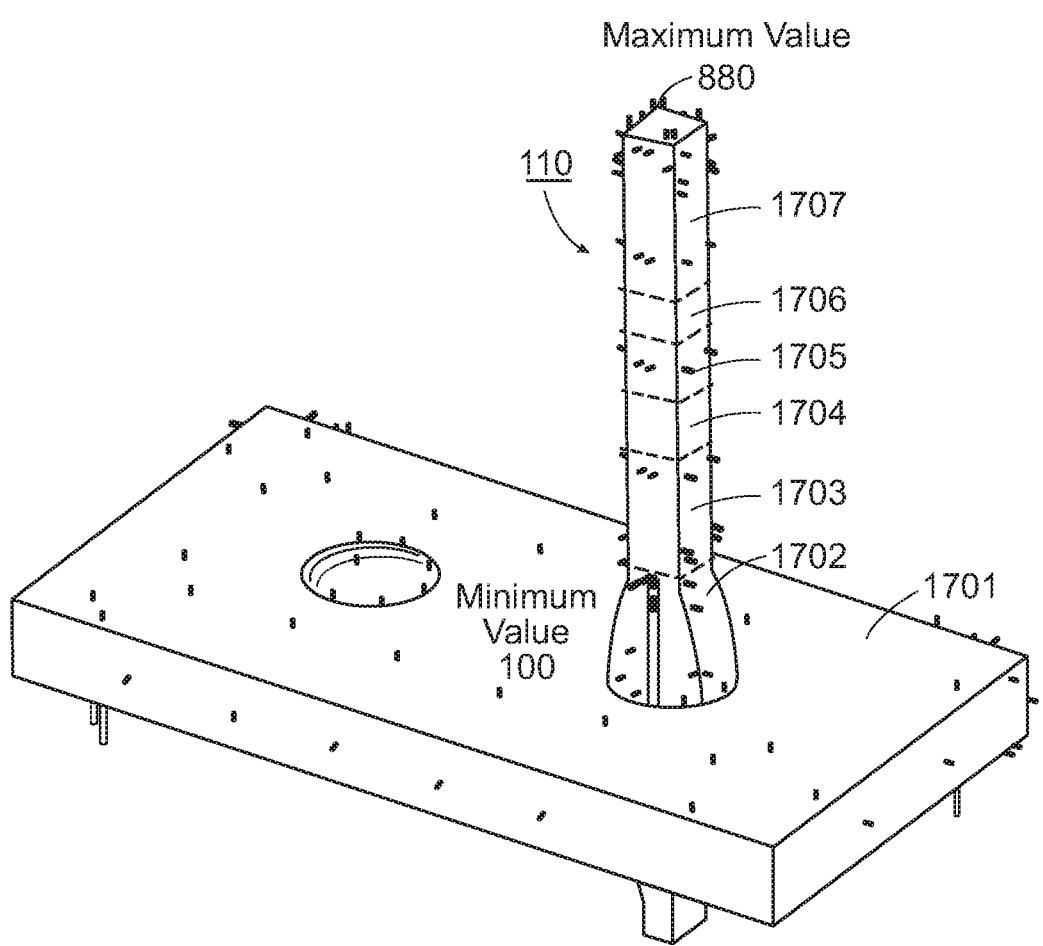
FIG. 17 is a graph illustrating thermal distribution according to a heat simulation of a press-fit pin according to the related art.
Figure 18:
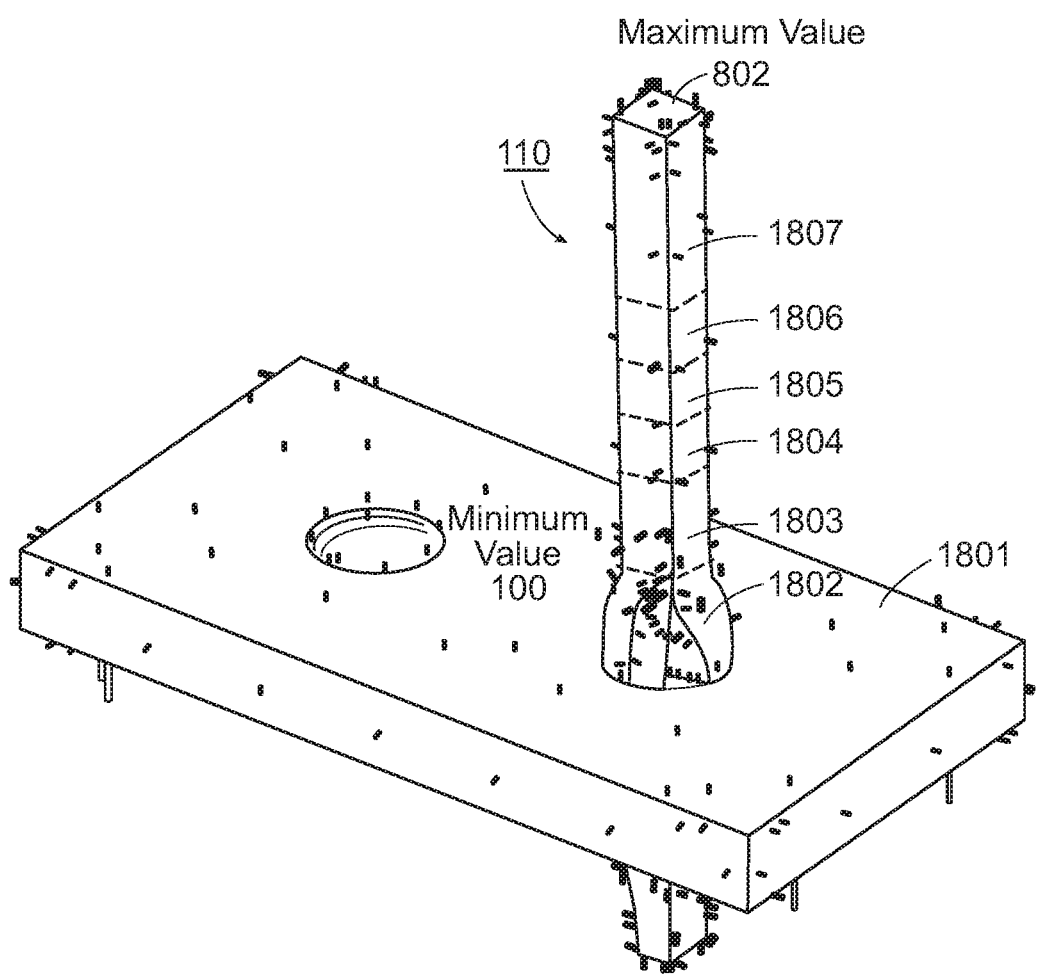
FIG. 18 is a graph illustrating thermal distribution according to a heat simulation of a press-fit pin according to a first exemplary embodiment of the present disclosure.
Figure 19:
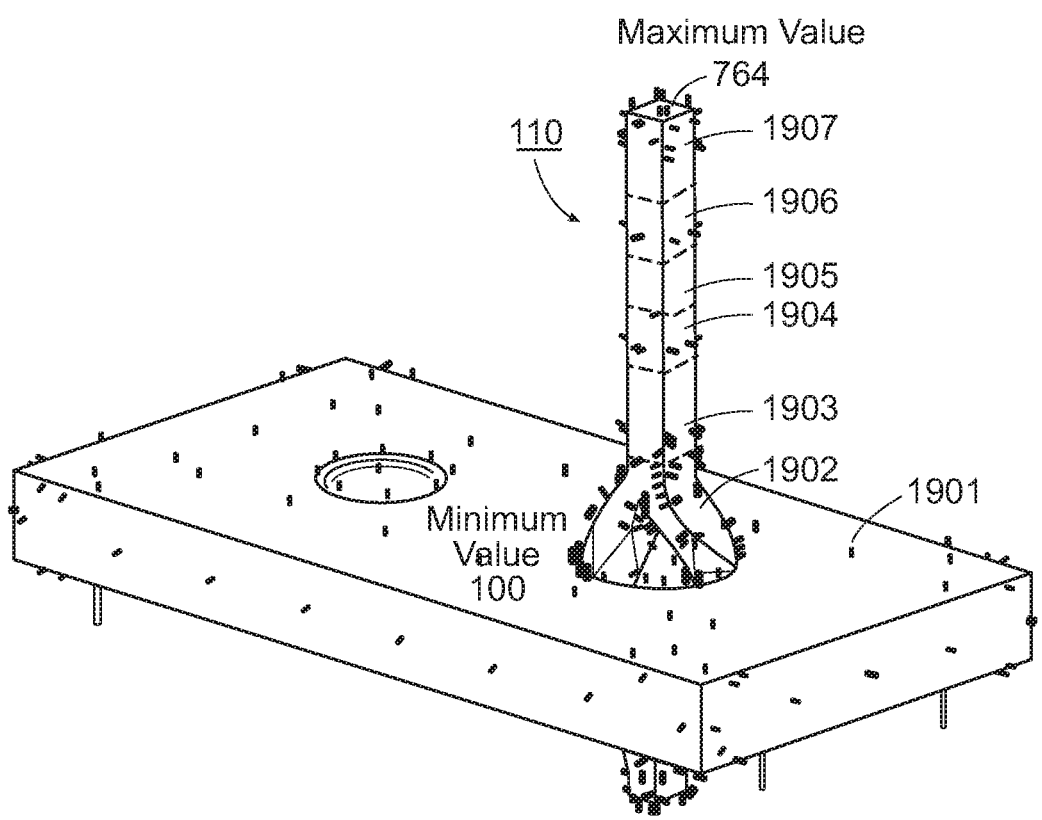
FIG. 19 is a graph illustrating thermal distribution according to a heat simulation of a press-fit pin according to a third exemplary embodiment of the present disclosure.

Hereinafter, the increase of the heat transfer efficiency in accordance with a shape of the press-fit pin 110 according to the present disclosure will be described with reference to FIGS. 17 to 19. FIG. 17 illustrates a thermal simulation result of a linear press-fit pin 110 of the related art. As illustrated, temperature changes gradually from a minimum value of 100° C. in the area identified by 1701 to approximately 100-295° C. in 1702, 295-360° C. in 1703, 360-490° C. in 1704, 490-685° C. in 1705, 685-750° C. in 1706, and 750° C. to the maximum value of 880° C. in 1707. FIG. 18 illustrates a thermal simulation result of a press-fit pin 110 according to a first exemplary embodiment of the present disclosure. The temperature changes gradually from a minimum value of 100° C. in the area identified by 1801 to approximately 100-276° C. in 1802, 276-334° C. in 1803, 334-451° C. in 1804, 451-468° C. in 1805, 568-685° C. in 1806, and 685° C. to a maximum of 802° C. in 1807. FIG. 19 illustrates a thermal simulation result of a press-fit pin 110 according to a third exemplary embodiment of the present disclosure. The temperature changes gradually from a minimum value of 100° C. in the area identified by 1901 to approximately 155-266° C. in 1902, 266-432° C. in 1903, 432 to 543° C. in 1904, 543-598° C. in 1905, 598-653° C. in 1906, and 653° C. to a maximum of 764° C. in 1907.

When an uppermost portion of the press-fit pin 110 was assumed as a 60 W heating body, a heat flux of 250 W/m$^2$ was applied, and a bottom temperature was assumed as 100° C., the highest temperature of the press-fit pin 110 of the related art illustrated in FIG. 17 was 880° C., but the highest temperature of the press-fit pin 110 according to the first exemplary embodiment of the present disclosure illustrated in FIG. 18 was 802° C., and the highest temperature of the press-fit pin 110 according to the third exemplary embodiment of the present disclosure illustrated in FIG. 19 was 764° C. That is, as compared with the related art, the press-fit pin 110 according to the present disclosure ensures a larger contact area so that excellent heat transfer efficiency may be obtained. Specifically, as compared with the first exemplary embodiment, in the third exemplary embodiment in which the press-fit pin has an outer peripheral surface having a complementary shape to the inner peripheral surface, the heat transfer efficiency is more excellent.

A detailed description of the present disclosure of the present specification explains exemplary embodiments, and the present disclosure is not limited thereto. Various changes and modification of the above-described exemplary embodiment can be made by those skilled in the art without departing from the technical spirit of the present disclosure and the technical spirit of the present disclosure includes all the changes and modifications.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A press-fit pin of a semiconductor package, comprising:
an end portion; and
a press unit which extends from the end portion and is divided into a first press-fitting piece and a second press-fitting piece,
wherein the first press-fitting piece forms a convex portion in a first direction perpendicular to a direction of the press-fit pin and is bent to a second direction which is perpendicular to the direction of the press-fit pin and forms 30 degrees to 110 degrees with the first direction, and
the second press-fitting piece forms a convex portion in a third direction which is perpendicular to the direction of the press-fit pin and forms 180 degrees with the first direction and is bent to a fourth direction which is perpendicular to the direction of the press-fit pin and forms 250 degrees to 330 degrees with the first direction.

2. The press-fit pin according to claim 1, wherein the press unit further includes a slit formed between the first press-fitting piece and the second press-fitting piece.

3. The press-fit pin according to claim 2, wherein the first press-fitting piece gradually expands to the first direction as it is further away from the end portion to the press-fit pin direction and then is gradually converged toward the third direction, and the second press-fitting piece gradually expands to the third direction as it is further away from the end portion to the press-fit pin direction and then is gradually converged toward the first direction.

4. The press-fit pin according to claim 3, wherein the first press-fitting piece is gradually bent to the second direction as it is further away from the end portion to the press-fit pin direction and then is gradually converged toward the fourth direction, and the second press-fitting piece is gradually bent to the fourth direction as it is further away from the end portion to the press-fit pin direction and then is gradually converged toward the second direction.

5. The press-fit pin according to claim 4, wherein the first press-fitting piece most expands to the first direction and is most bent to the second direction at a contact point which is formed in an area corresponding to 40% to 60% of a height of the press unit and the second press-fitting piece most expands to the third direction and is most bent to the fourth direction at the contact point.

6. The press-fit pin according to claim 1, wherein the first press-fitting piece is bent to the second direction which forms 30 degrees to 60 degrees with the first direction and the second press-fitting piece is bent to the fourth direction which forms 330 degrees to 300 degrees with the first direction.

7. The press-fit pin according to claim 1, wherein the first press-fitting piece and the second press-fitting piece include outer peripheral surfaces having a complementary shape to an inner peripheral surface of a contact hole into which the press-fit pin is inserted.

8. The press-fit pin according to claim 7, wherein the first press-fitting piece and the second press-fitting piece have a transverse cross-section having one quarter circular arc shape at the contact point which is formed in an area corresponding to 40% to 60% of a height of the press unit.

9. The press-fit pin according to claim 1, wherein the press unit further includes a first step which is formed in an area corresponding to 60% or more of height of the press unit and prevents the press-fit pin from being excessively inserted.

10. The press-fit pin according to claim 1, further comprising:

an extension portion which extends from the press unit to be opposite to the end portion, wherein the extension portion further includes a second step which prevents the press-fit pin from being excessively inserted.

11. The press-fit pin according to claim 1, further comprising:

an extension portion which extends from the press unit to be opposite to the end portion, wherein the extension portion further includes a bending structure which disperses an insertion impact of the press-fit pin.

12. The press-fit pin according to claim 11, wherein the extension portion further includes a third step and a fourth step which are formed between the bending structure and the press unit to be coupled to a bottom surface of the package body.

13. The press-fit pin according to claim 1, wherein the first press-fitting piece is bent to the second direction which forms 90 degrees with the first direction and the second press-fitting piece is bent to the fourth direction which forms 270 degrees with the first direction.

* * * * *